(12) United States Patent
Hu et al.

(10) Patent No.: US 10,833,894 B2
(45) Date of Patent: Nov. 10, 2020

(54) HYBRID-MODE LASER DRIVE CIRCUIT AND OPTICAL EMITTING SYSTEM

(71) Applicant: PhotonIC Technologies (Shanghai) Co., Ltd., Shanghai (CN)

(72) Inventors: Shang Hu, Shanghai (CN); Tingyu Yao, Shanghai (CN); Rui Bai, Shanghai (CN); Xuefeng Chen, Shanghai (CN); Pei Jiang, Shanghai (CN)

(73) Assignee: PhotonIC Technologies (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 16/544,920

(22) Filed: Aug. 20, 2019

(65) Prior Publication Data

US 2020/0059385 A1 Feb. 20, 2020

(51) Int. Cl.
*H04B 10/50* (2013.01)
*H04L 25/02* (2006.01)
*H04B 10/564* (2013.01)

(52) U.S. Cl.
CPC ....... *H04L 25/0282* (2013.01); *H04B 10/503* (2013.01); *H04B 10/564* (2013.01)

(58) Field of Classification Search
CPC ............. H04L 25/028; H04L 25/0272; H03K 19/018528; H03K 19/018514; H04B 10/503; H04B 10/564; H04B 10/504; H01S 5/00; H01S 5/042
See application file for complete search history.

(56) References Cited

U.S. PATENT DOCUMENTS 5,656,960 A * 8/1997 Holzer ............ H03K 19/00361
327/108

* cited by examiner

*Primary Examiner* — Sibin Chen

(57) ABSTRACT

The present disclosure provides a hybrid-mode laser drive circuit and an optical emitting system. An equalizer circuit is configured to generate, according to a data signal and a clock signal, an equalization signal for compensating a hybrid-mode laser drive circuit; the hybrid-mode laser drive circuit is connected to an output end of the equalizer circuit, and is configured to generate a corresponding drive signal according to an output signal of the equalizer circuit, so as to drive a light emitting diode to generate a corresponding optical signal; a third current source is connected between a power supply voltage and an output end of the hybrid-mode laser drive circuit; an anode of the light emitting diode is connected to the output end of the hybrid-mode laser drive circuit and a cathode of the light emitting diode is connected to a power supply ground.

9 Claims, 6 Drawing Sheets

HYBRID-MODE LASER DRIVE CIRCUIT AND OPTICAL EMITTING SYSTEM

CROSS REFERENCES TO RELATED APPLICATION

This application claims the benefits of priority to Chinese Patent Application No. CN 2018109476666, entitled "Hybrid-Mode Laser Drive Circuit and Optical Emitting System", filed with CNIPA on Aug. 20, 2018, the contents of which are incorporated herein by reference in its entirety.

BACKGROUND OF THE PRESENT DISCLOSURE

Field of Disclosure

The present disclosure relates to field of optical communication technology, and in particular, to a hybrid-mode laser drive circuit, and an optical emitting system.

Description of Related Arts

Data centralization gradually uses optical interconnection instead of copper interconnection to meet bandwidth requirement. In both a direct modulation laser and an external modulation laser, power consumption of an optical transmitter chip accounts for a large proportion of overall power consumption of a module. Therefore, how to improve the energy efficiency of the optical transmitter chip is a main direction of research at present. A laser drive circuit is a major power consuming module of the optical transmitter chip, which consumes about more than 50% of the power. Therefore, decreasing the power consumption of the laser drive circuit can significantly reduce the overall power consumption of the transmitter chip. Moreover, bandwidth is also an important index for the laser drive circuit.

SUMMARY OF THE PRESENT DISCLOSURE

The present disclosure provides a hybrid-mode laser drive circuit and an optical emitting system, to resolve the bandwidth and power consumption of a laser drive circuit cannot be taken into account at the same time.

The present disclosure provides a hybrid-mode laser drive circuit, at least comprising: a pre-drive unit, configured to receive an input signal and generate a pre-drive signal according to the input signal, where the pre-drive signal and the input signal have opposite phases; and a drive unit, configured to receive the input signal and the pre-drive signal, where the pre-drive signal is used for controlling the input signal to be output in a push-pull manner.

Preferably, the pre-drive unit comprises: a first N-type metal-oxide-semiconductor (NMOS) transistor, a second NMOS transistor, a first current source, a first load, and a second load; the first NMOS transistor and the second NMOS transistor form a differential pair; sources of the first NMOS transistor and the second NMOS transistor are interconnected and are then connected to a negative electrode of a first reference power supply through the first current source; a gate of the first NMOS transistor is connected to a positive-phase input signal, and a drain of the first NMOS transistor is connected to the first load and then connected to a positive electrode of the first reference power supply; a gate of the second NMOS transistor is connected to a negative-phase input signal, and a drain of the second NMOS transistor is connected to the second load and then connected to the positive electrode of the first reference power supply; the drain of the first NMOS transistor outputs a negative-phase pre-drive signal, and the drain of the second NMOS transistor outputs a positive-phase pre-drive signal.

Preferably, the drive unit comprises a third NMOS transistor, a fourth NMOS transistor, a fifth NMOS transistor, a sixth NMOS transistor, a seventh NMOS transistor, an eighth NMOS transistor, and a second current source; the third NMOS transistor and the fourth NMOS transistor form a differential pair; sources of the third NMOS transistor and the fourth NMOS transistor are interconnected and then connected to a negative electrode of a second reference power supply through the second current source; a gate of the third NMOS transistor is connected to a positive-phase input signal, and a drain of the third NMOS transistor is connected to a source of the fifth NMOS transistor; a gate of the fifth NMOS transistor is connected to a reference voltage, and a drain of the fifth NMOS transistor is connected to a source of the seventh NMOS transistor; a gate of the seventh NMOS transistor is connected to a negative-phase pre-drive signal, and a drain of the seventh NMOS transistor is connected to a positive electrode of the second reference power supply; a gate of the fourth NMOS transistor is connected to a negative-phase input signal, and a drain of the fourth NMOS transistor is connected to a source of the sixth NMOS transistor; a gate of the sixth NMOS transistor is connected to the reference voltage, and a drain of the sixth NMOS transistor is connected to a source of the eighth NMOS transistor; a gate of the eighth NMOS transistor is connected to a positive-phase pre-drive signal, and a drain of the eighth NMOS transistor is connected to the positive electrode of the second reference power supply; a connection end of the drain of the sixth NMOS transistor and the source of the eighth NMOS transistor is used as an output end of the drive unit.

More preferably, a positive electrode of a reference power supply of the pre-drive unit is connected to a negative electrode of a reference power supply of the drive unit, and current flows from a positive electrode of the reference power supply of the drive unit to a negative electrode of the reference power supply of the pre-drive unit.

More preferably, the positive electrode of the reference power supply of the drive unit is connected to a supply voltage, the negative electrode of the reference power supply of the pre-drive unit is connected to a power supply ground, a level of the positive electrode of the reference power supply of the pre-drive unit and a level of the negative electrode of the reference power supply of the drive unit are between the supply voltage and the power supply ground.

More preferably, the input signal in the drive unit and an input end of the pre-drive signal are each connected to a level conversion module.

More preferably, the level conversion module is an alternating-current coupling module.

The present disclosure provides an optical emitting system, at least comprising: an equalizer circuit, the foregoing hybrid-mode laser drive circuit, a third current source, and a light emitting diode, wherein the equalizer circuit is configured to receive a data signal and a clock signal, and generate, according to the data signal and the clock signal, an equalization signal for compensating the hybrid-mode laser drive circuit; the hybrid-mode laser drive circuit is connected to an output end of the equalizer circuit, and is configured to generate a corresponding drive signal according to an output signal of the equalizer circuit, so as to drive the light emitting diode to generate a corresponding optical signal; the third current source is connected between a power supply voltage and an output end of the hybrid-mode laser drive circuit; and a anode of the light emitting diode is connected to the output end of the hybrid-mode laser drive circuit and a cathode of the light emitting diode is connected to a power supply ground.

As described above, the hybrid-mode laser drive circuit and optical emitting system according to the present disclosure have the following beneficial effects:

The hybrid-mode laser drive circuit and optical emitting system according to the present disclosure employs a push-pull output manner, so that power consumption of a current is reduced while bandwidth is increased, and the performance of the laser drive circuit is greatly improved, thereby improving the performance of the optical emitting system.

LIST OF REFERENCE NUMERALS

1 Current-mode circuit
2 Hybrid-mode laser drive circuit
21 Pre-drive unit
22 Drive unit
221 to 224 First to fourth alternating-current coupling modules

DETAILED DESCRIPTION OF THE PREFERRED EMBODIMENTS

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

Figure 1:
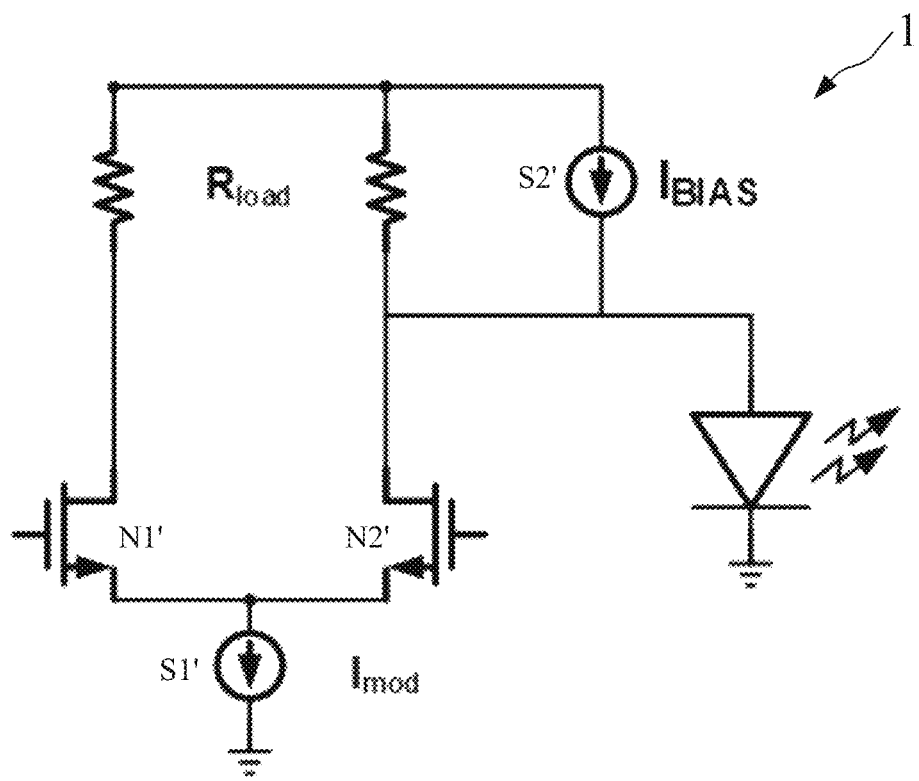
FIG. 1 is a schematic diagram of a current-mode logic (CML) circuit.

A current-mode logic (CML) circuit has a good capability of suppressing power supply noise and ground noise. FIG. 1 shows a structure of a CML circuit 1. Sources of differential pair transistors N1' and N2' are interconnected and are connected to a current source S1' and then grounded. Gates of the differential pair transistors N1' and N2' are each connected to an input signal. And drains of the differential pair transistors N1' and N2' are each connected to a power supply through a load Rload. A current source S2' is connected between the power supply and an output end of the CML circuit. A positive electrode of a light emitting diode is connected to the output end of the CML circuit, and a cathode of the light emitting diode is grounded. The power consumption and bandwidth of the light emitting diode meet the following relationships:

$$I_{mod} = \frac{I_{mod,vcsel} \cdot R_{vcsel}}{R_{load} // R_{vcsel}}$$

Time Constant $= (R_{load} // R_{vcsel}) \cdot C_{load}$ where $I_{mod}$ is a current flowing through the current source S1', $I_{mod, vcsel}$ is a current flowing through the light emitting diode, $R_{vcsel}$ is a resistance value of on-resistance of the light emitting diode, $R_{load}$ is a resistance value of the load, Time Constant is a time constant (which is in direct proportion to the bandwidth), and $C_{load}$ is a value of parasitic capacitance of the output end of the CML circuit.

It can be learned from the foregoing formulas that, the CML circuit can achieve a high bandwidth. However, the bandwidth of the CML circuit needs to be compromised with the power consumption. The bandwidth and the power consumption have a direct relationship, increasing the bandwidth will increase the power consumption.

Embodiment 1

Figure 2:
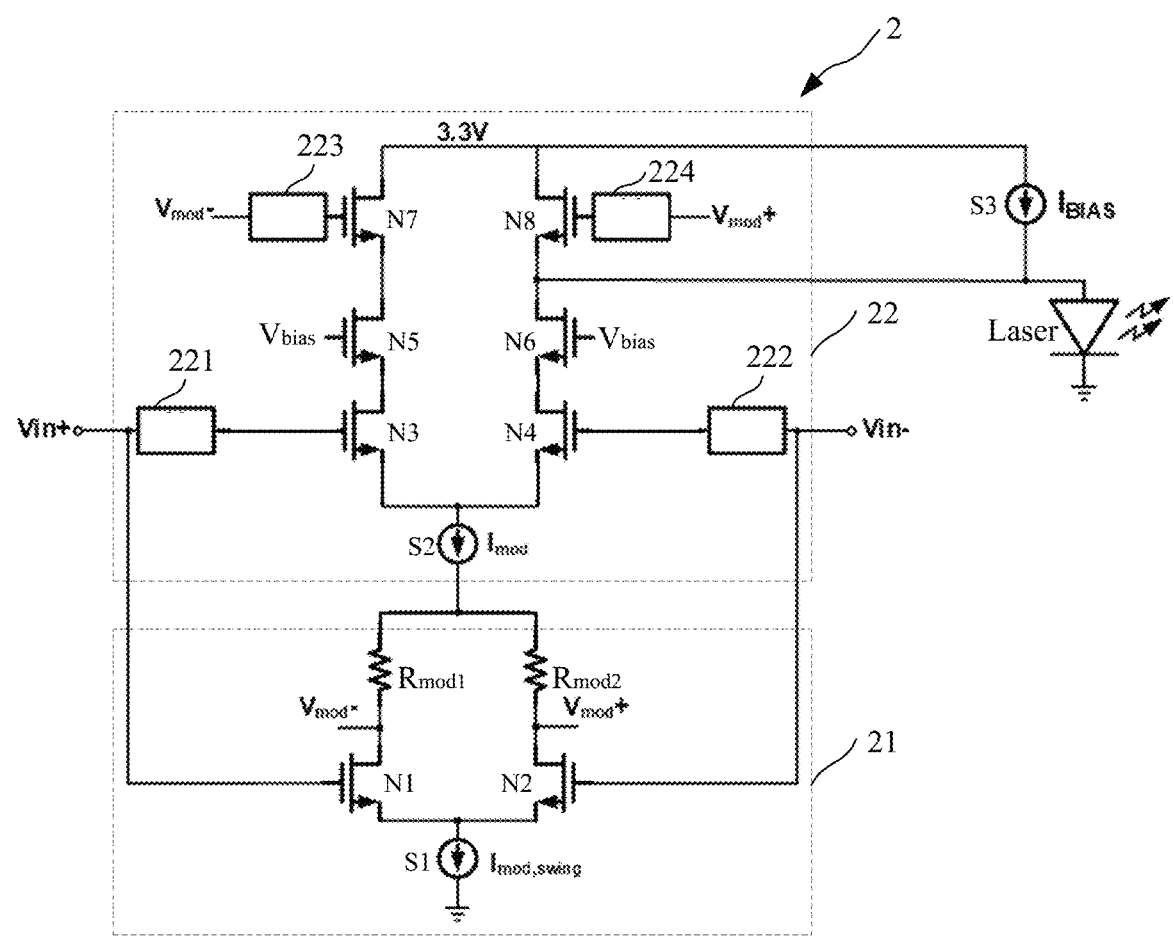
FIG. 2 is a schematic diagram of a hybrid-mode laser drive circuit according to the present disclosure.

As shown in FIG. 2, this embodiment provides a hybrid-mode laser drive circuit 2. The hybrid-mode laser drive circuit 2 comprises:

a pre-drive unit 21 and a drive unit 22.

As shown in FIG. 2, the pre-drive unit 21 receives an input signal and generates a pre-drive signal according to the input signal, the pre-drive signal and the input signal have opposite phases.

Specifically, in this embodiment, the pre-drive unit 21 includes a first N-type metal-oxide-semiconductor (NMOS) transistor N1, a second NMOS transistor N2, a first current source S1, a first load Rmod1, and a second load Rmod2. The first NMOS transistor N1 and the second NMOS transistor N2 form a differential pair. Sources of the first NMOS transistor N1 and the second NMOS transistor N2 are interconnected, then connected to a negative electrode of a first reference power supply through the first current source S1.

In this embodiment, the negative electrode of the first reference power supply is a power supply ground. A gate of the first NMOS transistor N1 is connected to a positive-phase input signal Vin+, and a drain of the first NMOS transistor N1 is connected to the first load Rmod1 and then connected to a positive electrode of the first reference power supply. In this embodiment, the positive electrode of the first reference power supply is set to 0.95 V. A gate of the second NMOS transistor N2 is connected to a negative-phase input signal Vin−, and a drain of the second NMOS transistor N2 is connected to the second load Rmod2 and then connected to the positive electrode of the first reference power supply. The drain of the first NMOS transistor N1 outputs a negative-phase pre-drive signal Vmod−, the drain of the second NMOS transistor N2 outputs the positive-phase pre-drive signal Vmod+. In this embodiment, the first load Rmod1 and the second load Rmod2 have the same resistance value.

As shown in FIG. 2, the drive unit 22 receives the input signal and the pre-drive signal, and the pre-drive signal is used for controlling the input signal to be output in a push-pull manner.

Specifically, in this embodiment, the drive unit 22 includes a third NMOS transistor N3, a fourth NMOS transistor N4, a fifth NMOS transistor N5, a sixth NMOS transistor N6, a seventh NMOS transistor N7, an eighth NMOS transistor N8, and a second current source S2. The drive unit 22 has a cascode structure. The third NMOS transistor N3 and the fourth NMOS transistor N4 form a differential pair. Sources of the third NMOS transistor N3 and the fourth NMOS transistor N4 are interconnected, and then connected to a negative electrode of a second reference power supply through the second current source S2.

In this embodiment, the negative electrode of the second reference power supply is connected to the positive electrode of the first reference power supply, to implement a laminate structure. A gate of the third NMOS transistor N3 is connected to a positive-phase input signal Vin+, and a drain of the third NMOS transistor N3 is connected to a source of the fifth NMOS transistor N5. A gate of the fifth NMOS transistor N5 is connected to a reference voltage Vbias, and a drain of the fifth NMOS transistor N5 is connected to a source of the seventh NMOS transistor N7. A gate of the seventh NMOS transistor N7 is connected to a negative-phase pre-drive signal Vmod−, and a drain of the seventh NMOS transistor N7 is connected to a positive electrode of the second reference power supply. In this embodiment, the positive electrode of the second reference power supply is connected to a supply voltage (a value of the supply voltage is 3.3 V). A gate of the fourth NMOS transistor N4 is connected to a negative-phase input signal Vin−, and a drain of the fourth NMOS transistor N4 is connected to a source of the sixth NMOS transistor N6. A gate of the sixth NMOS transistor N6 is connected to the reference voltage Vbias, and a drain of the sixth NMOS transistor N6 is connected to a source of the eighth NMOS transistor N8. A gate of the eighth NMOS transistor N8 is connected to a positive-phase pre-drive signal Vmod+, and a drain of the eighth NMOS transistor N8 is connected to the positive electrode of the second reference power supply. A connection end of the drain of the sixth NMOS transistor N6 and the source of the eighth NMOS transistor N8 is used as an output end of the drive unit 22.

It should be noted that, in this embodiment, a positive electrode of a reference power supply of the pre-drive unit 21 is connected to a negative electrode of a reference power supply of the drive unit 22, and the current flows from a positive electrode of the reference power supply of the drive unit 21 to a negative electrode of the reference power supply of the pre-drive unit 22, thereby saving the current. The current is reused through the laminate structure. The current in the drive unit 22 flows to the pre-drive unit 21 and is reused by the pre-drive unit 21, thereby further reducing the power consumption.

Specifically, the input signal in the drive unit 22 and an input end of the pre-drive signal are each connected to a level conversion module. In this embodiment, the level conversion modules include a first alternating-current coupling module 221 connected to an input end of the positive-phase input signal Vin+, a second alternating-current coupling module 222 connected to an input end of the negative-phase input signal Vin−, a third alternating-current coupling module 223 connected to an input end of the positive-phase pre-drive signal Vmod+, and a fourth alternating-current coupling module 224 connected to an input end of the negative-phase pre-drive signal Vmod−. Level conversion is implemented through alternating-current coupling. The circuit for level conversion may be any existing technology applicable to the present disclosure, which are not limited to this embodiment.

Figure 3:
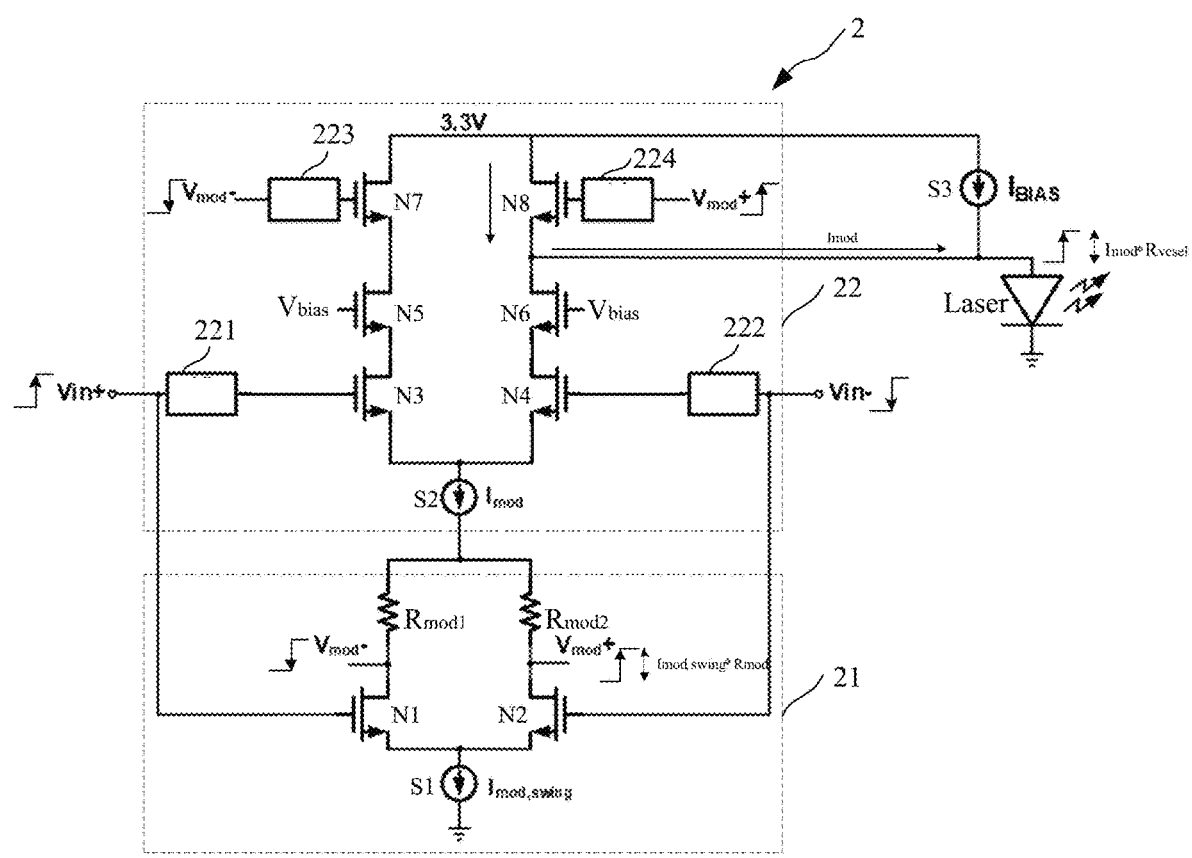
FIGS. 3 to 4 are a schematic diagram of a working principle of a hybrid-mode laser drive circuit according to the present disclosure.

A working principle of the hybrid-mode laser drive circuit 2 is as follows:

As shown in FIG. 3, when the positive-phase input voltage Vin+ is at a high level and the negative-phase input voltage Vin− is at a low level, the first NMOS transistor N1 is turned on, and the second NMOS transistor N2 is cut off. The drain of the first NMOS transistor N1 outputs the negative-phase pre-drive signal Vmod−, which is at a low level, and the drain of the second NMOS transistor N2 outputs the positive-phase pre-drive signal Vmod+, which is at the high level. The amplitude of the positive-phase pre-drive signal Vmod+ and the negative-phase pre-drive signal Vmod− is $I_{mod, swing} \cdot R_{mod}$, where $I_{mod, swing}$ is a resistance value of the first load Rmod1 or the second load Rmod2.

In this case, the fourth NOMS transistor N4 and the sixth NMOS transistor N6 are cut off; the third NOMS transistor N3 and the fifth NMOS transistor N5 are turned on. The gate and source of the seventh NMOS transistor N7 change in the same phase (voltages both decrease). Therefore, the seventh NMOS transistor N7 is not conductive dynamically. The gate of the eighth NMOS transistor N8 is connected to the high level, the eighth NMOS transistor N8 is turned on. In this case, the current flows from the drain of the eighth NMOS transistor N8 to the source, and is output to the hybrid-mode laser drive circuit 2 to supply the current for the light emitting diode. The amplitude of the output current $I_{mod}$ is $I_{mod} \cdot R_{vcsel}$, where $I_{mod}$ is an output current, $R_{vcsel}$ is an on-resistance of a photoelectric light emitting diode.

Figure 4:
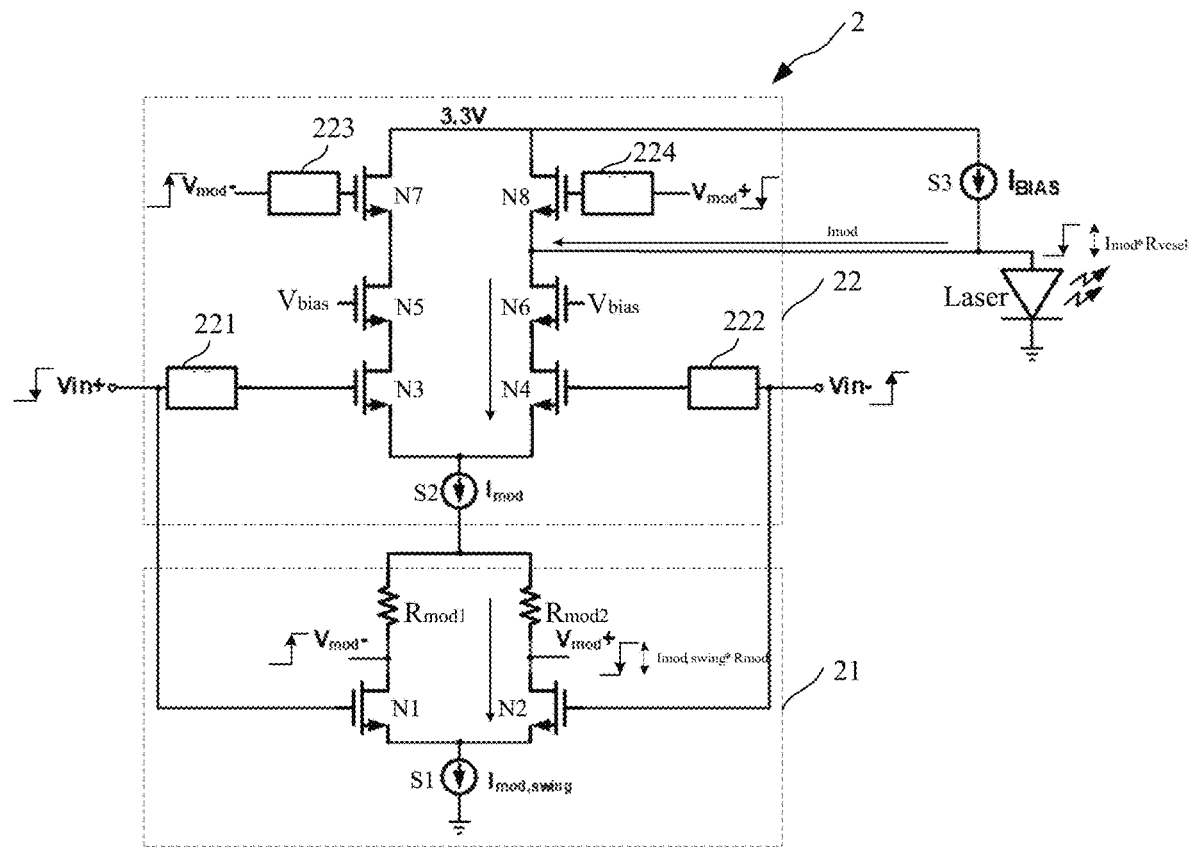

As shown in FIG. 4, when the positive-phase input voltage Vin+ is at the low level and the negative-phase input voltage Vin− is at the high level, the first NMOS transistor N1 is cut off, and the second NMOS transistor N2 is turned on. The drain of the first NMOS transistor N1 outputs the negative-phase pre-drive signal Vmod−, which is at the high level, the drain of the second NMOS transistor N2 outputs the positive-phase pre-drive signal Vmod+, which is at the low level. The amplitude of the positive-phase pre-drive signal Vmod+ and the negative-phase pre-drive signal Vmod− is $I_{mod, swing} \cdot R_{mod}$, where $I_{mod, swing}$ is a resistance value of the first load Rmod1 or the second load Rmod2.

In this case, the fourth NOMS transistor N4 and the sixth NMOS transistor N6 are turned on; the third NOMS transistor N3 and the fifth NMOS transistor N5 are cut off. The gate and source of the eighth NMOS transistor N8 change in the same phase (voltages both decrease). Therefore, the eighth NMOS transistor N8 is not conductive dynamically. The gate of the seventh NMOS transistor N7 is connected to the high level, the seventh NMOS transistor N7 is turned on. In this case, the current flows from the drain of the sixth NMOS transistor N6 to the source to the power supply ground through the fourth NMOS transistor N4, the second load Rmod2, and the second NMOS transistor N2.

It should be noted that, each alternating-current coupling module removes direct-current components in the input signal and the drive signal through alternating-current coupling, thereby implementing level conversion for the input signal of the laminate structure.

It should be noted that, overvoltage protection can be implemented by adjusting the bias voltage Vbias of the fifth NMOS transistor N5 and the sixth NMOS transistor N6, and the output impedance can be improved.

The bandwidth and power consumption of the hybrid-mode laser drive circuit in this embodiment meet the following relationships:

$$I_{mod} = \frac{I_{mod,vcsel} \cdot R_{vcsel}}{1/gm // R_{vcsel}}$$

$$\text{Time Constant} = (1/gm // R_{vcsel}) \cdot C_{load}$$

where $I_{mod}$ is an output current, $I_{mod,\ vcsel}$ is a current flowing through the light emitting diode, $R_{vcsel}$ is a resistance value of the on-resistance of the light emitting diode, gm is a transconductance of the NMOS, Time Constant is in direct proportion to the bandwidth, and $C_{load}$ is a value of the parasitic capacitance of the output end of the drive circuit.

From the perspective of the bandwidth, under the circumstance of theory-limit power consumption (Imod=Imod, vcsel), the value of 1/gm is small, which is approximately under 10 ohm. The resulting bandwidth is the parasitic capacitance of the output end of the drive circuit multiplied by a union of 10 ohm and the on-resistance of the light emitting diode. From the perspective of the current consumption, under the circumstance of such a small resistance as 1/gm, because the current is generated through the NMOS transistor, this part of current is not wasted, thereby reducing the power consumption.

Embodiment 2

Figure 5:
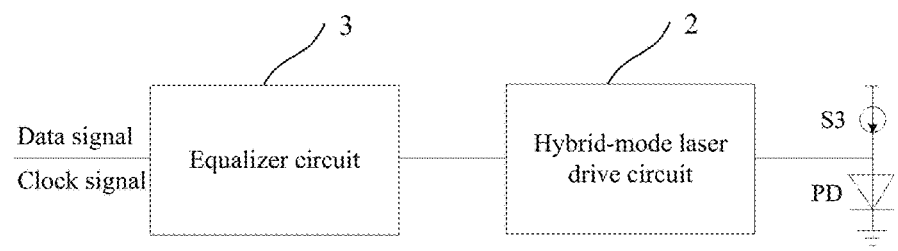
FIG. 5 is a schematic diagram of an optical emitting system according to the present disclosure.

As shown in FIG. 5, this embodiment provides an optical emitting system. The optical emitting system comprises: an equalizer circuit 3, the hybrid-mode laser drive circuit 2, a third current source S3, and a light emitting diode Laser.

As shown in FIG. 5, the equalizer circuit 3 receives a data signal and a clock signal, and then generates, according to the data signal and the clock signal, an equalization signal for compensating the hybrid-mode laser drive circuit 2.

Specifically, the equalizer circuit 3 generates the equalization signal based on a level hopping mode of each data in the data signal. The equalization signal is used for driving the light emitting diode Laser.

As shown in FIG. 5, the hybrid-mode laser drive circuit 2 is connected to an output end of the equalizer circuit 3, and generates the drive signal according to the output signal of the equalizer circuit 3, so as to drive the light emitting diode Laser to generate a corresponding optical signal.

Specifically, the hybrid-mode laser drive circuit 2 has structure and principle same as those in Embodiment 1, and details are not described herein.

As shown in FIG. 5, the third current source S3 is connected between a supply voltage and an output end of the hybrid-mode laser drive circuit 2.

As shown in FIG. 5, an anode of the light emitting diode Laser is connected to the output end of the hybrid-mode laser drive circuit 2, and a cathode of the light emitting diode Laser is connected to a power supply ground.

Under the conditions that VCSEL R (an equivalent distributed Bragg reflection (DBR) resistance after the VCSEL laser is turned on)=100 ohm, $C_{esd,pad}$ (a capacitance value of an external electrostatic protection pad)=120 fF, bandwidth=200 pH, Ibias (a current flowing through the third current source S3)=7 mA, and Imod (an output current of the drive circuit 22)=7 mA, the performance comparison between the present disclosure and the prior art is as follows:

| Performance (in a non-return to zero coding mode) | The present disclosure | Conventional current-mode circuit |
|---|---|---|
| Rising-edge and falling edge time (20%-80%) | 10.5 ps | 13 ps |
| Current consumption | 18 mA | 30 mA |
| Power consumption | 60 mW | 100 mW |

It can be seen that the rising-edge and falling-edge time (calculated based on 20%-80% of the amplitude) in this application is shorter than that of the conventional current-mode circuit. The current consumption and power consumption in this application are both less than those of the conventional current-mode circuit.

Under the conditions that VCSEL R (an equivalent DBR resistance after the VCSEL laser is turned on)=100 ohm, $C_{esd,pad}$ (a capacitance value of an external electrostatic protection pad)=120 fF, bandwidth=200 pH, Ibias (a current flowing through the third current source S3)=9 mA, and Imod (an output current of the drive circuit 22)=9 mA, the performance comparison between the present disclosure and the prior art is as follows:

| Performance (in a fourth-order pulse amplitude modulation mode) | The present disclosure | Conventional current-mode circuit |
|---|---|---|
| Rising-edge and falling edge time (20%-80%) | 9 ps | 8 ps |
| Current consumption | 27 mA | 70 mA |
| Power consumption | 89 mW | 231 mW |

It can be seen that the rising-edge and falling-edge time (calculated based on 20%-80% of the amplitude) in this application is slightly longer than that of the conventional current-mode circuit. The current consumption and power consumption in this application are both far less than those of the conventional current-mode circuit.

Figure 6:
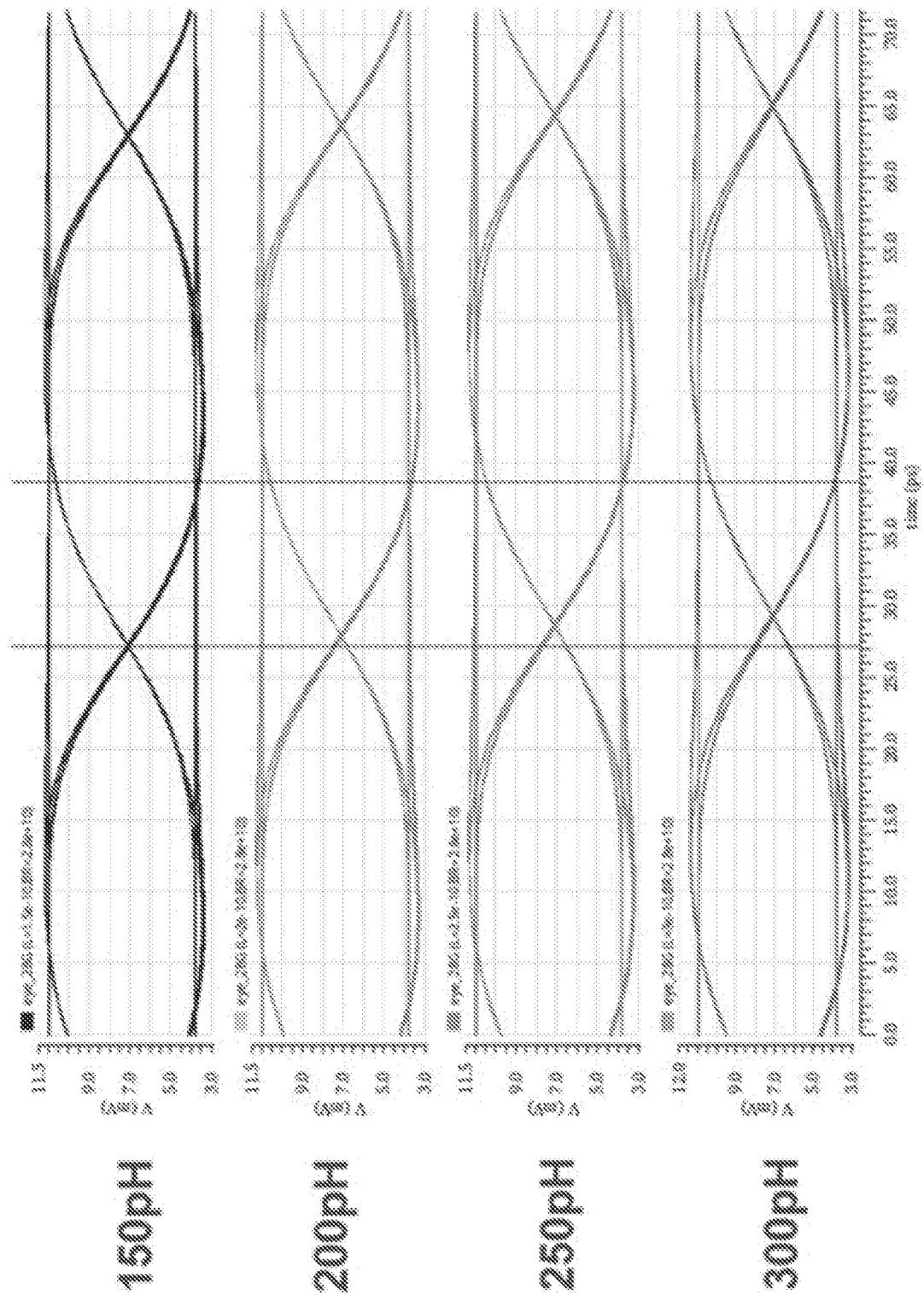
FIG. 6 is optical eye diagrams of the present disclosure under different bonding-wire parasitic capacitances.
Figure 7:
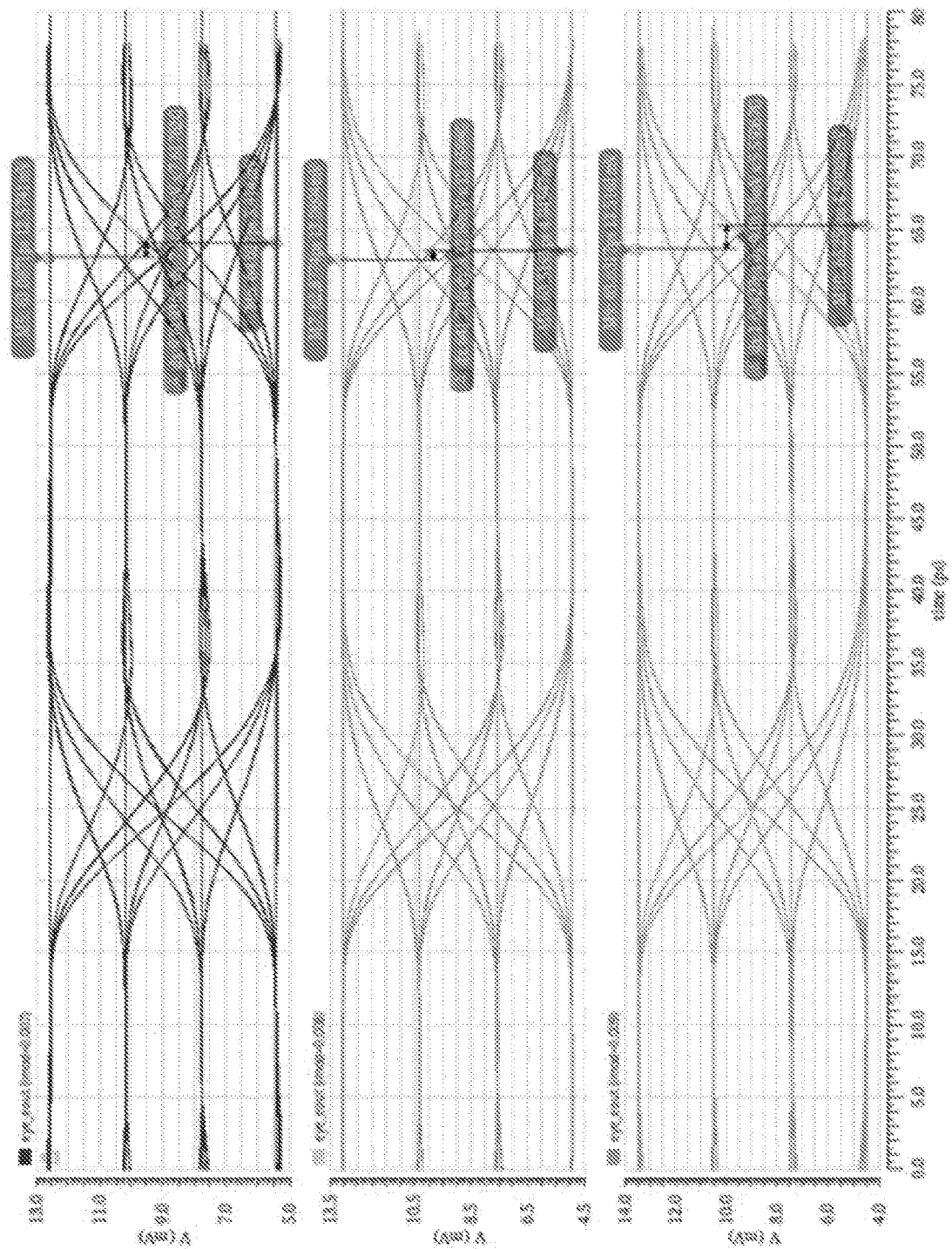
FIG. 7 is optical eye diagrams of the present disclosure under different output currents.

FIG. 6 is optical eye diagrams under different bonding-wire parasitic capacitances (150 pH, 200 pH, 250 pH, 300 pH). It can be seen that, the parasitic capacitances on different bonding wires do not affect the optical eye diagrams. FIG. 7 is optical eye diagrams under different output currents. It can be seen that, the optical eye diagrams under different output currents all have good quality.

The hybrid-mode laser drive circuit and optical emitting system according to the present disclosure employs a push-pull output manner, so that power consumption of a current is reduced while bandwidth is increased, and the performance of the laser drive circuit is greatly improved, thereby improving the performance of the optical emitting system.

In conclusion, the present disclosure provides a hybrid-mode laser drive circuit and an optical emitting system. The optical emitting system comprises: an equalizer circuit, a hybrid-mode laser drive circuit, a third current source, and a light emitting diode. The equalizer circuit receives a data signal and a clock signal, and generates, according to the data signal and the clock signal, an equalization signal for compensating the hybrid-mode laser drive circuit. The hybrid-mode laser drive circuit is connected to an output end of the equalizer circuit, and generates a corresponding drive signal according to an output signal of the equalizer circuit, so as to drive the light emitting diode to generate a corresponding optical signal. The third current source is connected between a power supply voltage and an output end of the hybrid-mode laser drive circuit. An anode of the light emitting diode is connected to the output end of the hybrid-mode laser drive circuit and a cathode of the light emitting diode is connected to a power supply ground. The hybrid-mode laser drive circuit and optical emitting system according to the present disclosure employ a push-pull output, so that power consumption of a current is reduced while bandwidth is increased, and the performance of the laser drive circuit is greatly improved, thereby improving the performance of the optical emitting system. Therefore, the present disclosure overcomes various disadvantages in the prior art and thus has high industrial use value.

The foregoing embodiments are only to illustrate the principle and efficacy of the present disclosure exemplarily, and are not to limit the present disclosure. Any person skilled in the art can make modifications or variations on the foregoing embodiments without departing from the spirit and scope of the present disclosure. Accordingly, all equivalent modifications or variations completed by those of ordinary skill in the art without departing from the spirit and technical thinking disclosed by the present disclosure should fall within the scope of claims of the present disclosure.

What is claimed is:

1. A hybrid-mode laser drive circuit, at least comprising:
   a pre-drive unit, configured to receive an input signal and obtain a pre-drive signal according to the input signal, wherein the pre-drive signal and the input signal have opposite phases; and
   a drive unit, configured to receive the input signal and the pre-drive signal, wherein the pre-drive signal is used for controlling the input signal to be output in a push-pull manner;
   wherein the drive unit comprises a third NMOS transistor, a fourth NMOS transistor, a fifth NMOS transistor, a sixth NMOS transistor, a seventh NMOS transistor, an eighth NMOS transistor, and a second current source; the third NMOS transistor and the fourth NMOS transistor form a differential pair; sources of the third NMOS transistor and the fourth NMOS transistor are interconnected and then connected to a negative electrode of a second reference power supply through the second current source; a gate of the third NMOS transistor is connected to a positive-phase input signal, and a drain of the third NMOS transistor is connected to a source of the fifth NMOS transistor; a gate of the fifth NMOS transistor is connected to a reference voltage, and a drain of the fifth NMOS transistor is connected to a source of the seventh NMOS transistor; a gate of the seventh NMOS transistor is connected to a negative-phase pre-drive signal, and a drain of the seventh NMOS transistor is connected to a positive electrode of the second reference power supply; a gate of the fourth NMOS transistor is connected to a negative-phase input signal, and a drain of the fourth NMOS transistor is connected to a source of the sixth NMOS transistor; a gate of the sixth NMOS transistor is connected to the reference voltage, and a drain of the sixth NMOS transistor is connected to a source of the eighth NMOS transistor; a gate of the eighth NMOS transistor is connected to a positive-phase pre-drive signal, and a drain of the eighth NMOS transistor is connected to the positive electrode of the second reference power supply; a connection end of the drain of the sixth NMOS transistor and the source of the eighth NMOS transistor is used as an output end of the drive unit.

2. The hybrid-mode laser drive circuit as in claim 1, wherein the pre-drive unit comprises: a first N-type metal-oxide-semiconductor (NMOS) transistor, a second NMOS transistor, a first current source, a first load, and a second load; the first NMOS transistor and the second NMOS transistor form a differential pair; sources of the first NMOS transistor and the second NMOS transistor are interconnected and are then connected to a negative electrode of a first reference power supply through the first current source; a gate of the first NMOS transistor is connected to a positive-phase input signal, and a drain of the first NMOS transistor is connected to the first load and then connected to a positive electrode of the first reference power supply; a gate of the second NMOS transistor is connected to a negative-phase input signal, and a drain of the second NMOS transistor is connected to the second load and then connected to the positive electrode of the first reference power supply; the drain of the first NMOS transistor outputs a negative-phase pre-drive signal, and the drain of the second NMOS transistor outputs a positive-phase pre-drive signal.

3. The hybrid-mode laser drive circuit as in claim 2, wherein a positive electrode of a reference power supply of the pre-drive unit is connected to a negative electrode of a reference power supply of the drive unit, and a current flows from a positive electrode of the reference power supply of the drive unit to a negative electrode of the reference power supply of the pre-drive unit.

4. The hybrid-mode laser drive circuit as in claim 1, wherein a positive electrode of a reference power supply of the pre-drive unit is connected to a negative electrode of a reference power supply of the drive unit, and a current flows from a positive electrode of the reference power supply of the drive unit to a negative electrode of the reference power supply of the pre-drive unit.

5. The hybrid-mode laser drive circuit as in claim 1, wherein a positive electrode of a reference power supply of the pre-drive unit is connected to a negative electrode of a reference power supply of the drive unit, and a current flows from a positive electrode of the reference power supply of the drive unit to a negative electrode of the reference power supply of the pre-drive unit.

6. The hybrid-mode laser drive circuit as in claim 5, wherein the positive electrode of the reference power supply of the drive unit is connected to a supply voltage, the negative electrode of the reference power supply of the pre-drive unit is connected to a power supply ground, a level of the positive electrode of the reference power supply of the pre-drive unit and a level of the negative electrode of the reference power supply of the drive unit are between the supply voltage and the power supply ground.

7. The hybrid-mode laser drive circuit as in claim 5, wherein the input signal in the drive unit and an input end of the pre-drive signal are each connected to a level conversion module.

8. The hybrid-mode laser drive circuit as in claim 7, wherein the level conversion module is an alternating-current coupling module.

9. An optical emitting system, at least comprising:
   an equalizer circuit, a hybrid-mode laser drive circuit, a third current source, and a light emitting diode, wherein the equalizer circuit is configured to receive a data signal and a clock signal, and generate, according to the data signal and the clock signal, an equalization signal for compensating the hybrid-mode laser drive circuit;
   the hybrid-mode laser drive circuit, at least comprises: a pre-drive unit, configured to receive an input signal and obtain a pre-drive signal according to the input signal, wherein the pre-drive signal and the input signal have opposite phases; and a drive unit, configured to receive the input signal and the pre-drive signal, wherein the pre-drive signal is used for controlling the input signal to be output in a push-pull manner;

the hybrid-mode laser drive circuit is connected to an output end of the equalizer circuit, and is configured to generate the drive signal according to an output signal of the equalizer circuit, so as to drive the light emitting diode to generate a corresponding optical signal;

the third current source is connected between a supply voltage and an output end of the hybrid-mode laser drive circuit; and an anode of the light emitting diode is connected to the output end of the hybrid-mode laser drive circuit and a cathode of the light emitting diode is connected to a power supply ground.

\* \* \* \* \*